ns Patent [19] [11] 4,210,704
Chandross et al. [45] Jul. 1, 1980

[54] ELECTRICAL DEVICES EMPLOYING A CONDUCTIVE EPOXY RESIN FORMULATION AS A BONDING MEDIUM

[75] Inventors: Edwin A. Chandross, Berkeley Heights; Louis H. Sharpe, Morris Township, Morris County, both of N.J.

[73] Assignee: Bell Telephone Laboratories Incorporated, Murray Hill, N.J.

[21] Appl. No.: 931,160

[22] Filed: Aug. 4, 1978

[51] Int. Cl.² .................. B32B 7/14; B32B 27/38; H01B 1/06
[52] U.S. Cl. .................. 428/414; 156/330; 252/500; 252/514; 260/37 EP; 428/195; 428/201; 428/204; 428/208; 428/328
[58] Field of Search .......... 260/37 EP, 33.2 EP; 156/330; 428/1, 195, 328, 329, 330, 414–416, 901, 913, 201, 204, 206, 208, 323; 548/341; 252/500, 511–514

[56] References Cited

U.S. PATENT DOCUMENTS

| 3,580,776 | 5/1971 | Shenfil et al. | 156/330 X |
| 3,795,047 | 3/1974 | Abolafia et al. | 156/330 X |
| 3,862,260 | 1/1975 | Sellers et al. | 428/415 X |
| 4,038,742 | 8/1977 | Kimball et al. | 156/330 X |
| 4,048,188 | 9/1977 | Baker et al. | 548/341 |

Primary Examiner—Bruce H. Hess
Attorney, Agent, or Firm—Peter A. Businger; Edward M. Fink

[57] ABSTRACT

A technique is described for the preparation of an electrically conductive adhesive system and electrical devices including such system. Briefly, the adhesive system comprises a novolac epoxy resin and a chemically blocked imidazole curing agent in combination with a viscosity reducer and conductive particles. The resulting adhesive system is found comparable to commercially available adhesive systems and is superior thereto with respect to thermal stability.

4 Claims, 1 Drawing Figure

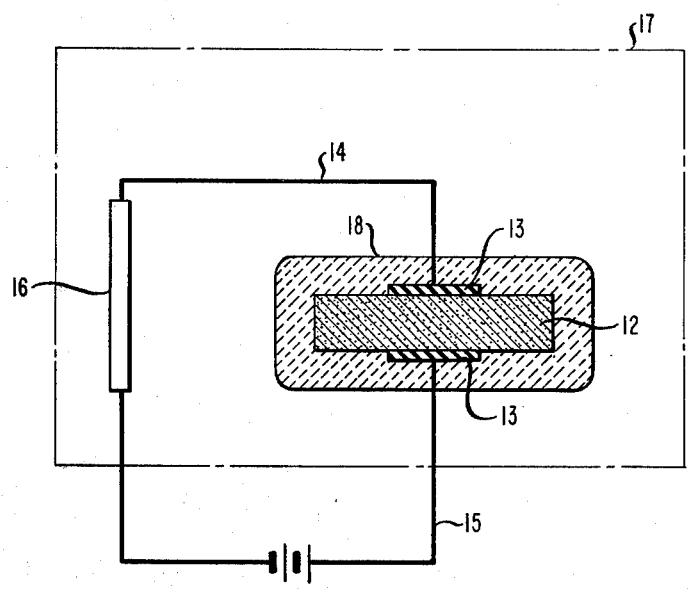

ELECTRICAL DEVICES EMPLOYING A CONDUCTIVE EPOXY RESIN FORMULATION AS A BONDING MEDIUM

This invention relates to an electrically conductive adhesive system and to electrical devices including such a system. More particularly, the present invention relates to an electrically conductive adhesive system including a chemically blocked imidazole curing agent and to electrical devices in which cured regions of the adhesive serve as the medium for bonding electrical compositions to substrates.

In recent years, the use of electrically conducting adhesives for bonding small semiconductor components to substrates has increased in popularity, such being attributed to the inherent advantages resulting from such use as compared with conventional silicon-gold eutectic bonding. Accordingly, workers in the art have focused their interest upon the development of conductive adhesive systems which are compatible with device materials and compounds. Although several of such systems are marketed commercially, the range of available properties has been somewhat limited, so resulting in continued investigatory efforts.

In accordance with the present invention, this end is attained in a novel adhesive system which is equivalent to commercially available adhesives from the standpoint of electrical and handling properties and superior thereto with respect to thermal stability. Briefly, the described system comprises a mixture of (a) a polyfunctional phenyl glycidyl ether, (b) a reactive viscosity reducer, (c) a conductivity component, (d) a curing agent, and (e) a conductivity enhancer. The resultant die-bonding adhesive composition evidences a range of available properties meeting commercial requirements for use in discrete devices and in integrated circuitry.

The invention will be more fully understood by reference to the following detailed description taken in conjunction with the accompanying drawing wherein:

The FIGURE is a front elevational view in cross-section of a typical device utilizing the adhesive system described herein.

A general description of the materials contemplated and the method of preparation of the adhesive system follows:

As indicated, the system employed includes a mixture of a polyfunctional epoxide, a reactive viscosity reducer, a conductive component, a curing agent and a conductivity enhancer. The polyfunctional epoxide may be selected from among the phenyl glycidyl ethers commonly known as epoxidized (as phenyl glycidyl ethers) "novolac" resins alone or in combination with resorcinol diglycidyl ether. The epoxidized novolac resins are characterized by a weight average molecular weight of 325 to 3500 relative to polystyrene standard (gel permeation chromatography) and at least 2 aryl moieties per molecule, the aryl nucleus of each moiety containing from 6 to 10 carbon atoms.

These resins have been found to offer the best combination of reactivity and overall stability in the final polymers. A particularly useful compound for this purpose is

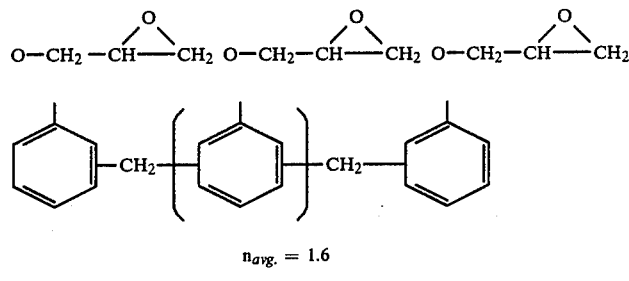

$n_{avg.} = 1.6$ a material which is stable from a chemical and thermal standpoint.

The epoxidized novolac resin chosen should evidence an average functionality of 2.0 to 4.0 epoxy groups per molecule. The use of resins having an average functionality less than 2.0 has been found to result in an unacceptable low degree of crosslinking whereas an average functionality in excess of 4 yields compositions whose viscosity is too high. The polymerized resin referred to evidences a high glass transition temperature and optimal thermal stability when cured in accordance with the technique described herein, so recommending its use in the described system.

The resorcinol diglycidyl ether is employed as a co-reactant with the novolac and is selected because of its high reactivity and high concentration of epoxy groups. Additionally, this compound does not significantly lower or degrade the glass transition temperature or thermal stability of the cured mixture while also serving to reduce the viscosity of the uncured mixture.

The reactive viscosity reducer is chosen from the mono or difunctional aliphatic diglycidyl ethers. Typical materials suitable for this purpose include the diglycidyl ethers of butanediol. These materials evidence low viscosity and high reactivity. The reactive viscosity reducer is present in an amount ranging from 0 to 100 parts per hundred, by weight, based on the weight of the epoxidized novolac.

The curing agents employed in the practice of the present invention are imidazole ureas. Although various imidazoles have been employed heretofore as curing agents for epoxy resins, studies have revealed that the known materials are unsatisfactory for the purposes intended herein due to levels of reactivity resulting in short pot life. Efforts to overcome this limitation initially focused upon incorporation of electron withdrawing substituents into the imidazole to reduce its catalytic activity. Unfortunately, this approach did not prove to be satisfactory, typically resulting in curing agents evidencing activity greater than or less than the desired level. Accordingly, interest was then focused upon the use of an imidazole which was rendered unreactive due to the presence of a blocking group on the #1 nitrogen atom, the blocking group subsequently being removed by a chemical reaction in the curing process to restore it to full activity.

The composition found suitable for this purpose is a 1(N-azacyclic carbamoyl) imidazole or a 1(N,N-dialkylcarbamoyl) imidazole having the general formula

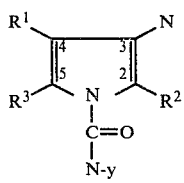

wherein $R^1$ represents hydrogen, a phenyl group or an alkoxyphenyl group having from 1–6 carbon atoms in the alkoxy chain; $R^2$ and $R^3$ represent an alkyl group of 1–6 carbon atoms, a phenyl group or hydrogen; and Y represents a cyclic group of the formula $(CH_2)_4$ or $(CH_2)_5$, or $O(CH_2)_4$; or two alkyl groups, $(R^4)_2$, wherein $R^4$ is an alkyl group having from 1–6 carbon atoms.

The curing agent may conveniently be prepared by reaction of an imidazole with a carbamoyl chloride in the presence of a tertiary anine. Thus, for example, 1-(N,N-dimethylcarbamoyl)-4-phenylimidazole, a composition preferred for this purpose may be obtained by reaction of 4-phenylimidazole with dimethylcarbamoyl chloride in the presence of triethylamine. The curing agent, which functions as a catalyst, is employed in an amount ranging from 0.03 to 0.1 mole per mole of epoxy group.

A typical procedure for the preparation of the 1-(N,N-dimethylcarbamoyl)-4-phenylimidazole employed herein is as follows:

A solution comprising 14.4 grams of 4-phenylimidazole, 12 grams of dimethylcarbamoyl chloride and 18 grams of triethylamine in 25 ml. of tetrahydrofuran was refluxed for 18 hours. The major fraction of the volatile material is then removed with a rotary evaporator whose trap contains water sufficient to destroy any condensed carbamoyl chloride. The residue is then dissolved in chloroform, extracted with water and dried over sodium sulfate. Crystallization from chloroformether yields the desired colorless solid, (18 g, 80%), m.p. 144.9°–145.3° C. (corr.) IR: 1700 cm$^{-1}$ Anal. calcd. for $C_{12}H_{13}N_3O$: C, 66.97; H, 6.09; N, 19.53 Found: C, 66.98, 66.79; H, 6.15, 6.10; N, 19.43, 1923.

The adhesive composition also includes conductivity components, typically metallic powders or flakes, having a maximum particle size typically ranging from 0.5–50 microns. This component of the system is employed in an amount typically ranging from 25 to 85% by weight, based upon the weight of the total composition.

Optionally, a conductivity enhancer designed to increase conductivity and lower resistivity may be employed. This material may be employed in an amount ranging from 0 to 10 percent by weight, based on the weight of the resin system. Materials suitable for this purpose include polyethylene glycols, solvents such as diethylene glycol mono butyl ether and esters thereof.

Preparation of the adhesive composition proceeds by mixing the epoxidized novolac resin with the resorcinol diglycidyl ether, a viscosity reducer and a conductivity enhancer in the requisite amounts. Next the curing agent is added to the resin mixture in a vessel which is then closed and heated, if required, to a temperature of approximately 60° C., for example by immersion of the vessel in hot water. The curing agent is dissolved with gradual agitation. In order to avoid undesirable advancement of the resin cure, the heating step is limited to a maximum of one hour.

Following, the conductivity component of the adhesive is added. This end may be attained by any convenient mechanical mixing procedure. After mixing, the material is stored at sub-freezing temperatures until ready for use at which time it is removed from the freezer and brought to room temperature before application. Curing of the adhesive system is effected by heating at a temperature ranging from 140°–200° C. over a time period ranging from 5 to 60 minutes.

Several examples of the present invention are set forth below. It will be understood that these examples are for purposes of exposition only and are not to be construed as limiting.

EXAMPLE 1

A resinous mixture was prepared in bulk comprising the following components:

(a) 50 parts, by weight, resorcinol diglycidyl ether having a viscosity ranging from 300 to 500 cps at 25° C. and an epoxy equivalent weight of approximately 127.

(b) 100 parts, by weight, of an epoxy novolac resin having an average of 3.6 epoxy groups per molecule, a viscosity ranging from 20,000 to 50,000 cps at 50° C. and an epoxy equivalent weight within the range of 176 to 181, (c) 20 parts, by weight, butanediol diglycidyl ether, (d) two parts, by weight, polyethylene glycol (molecular weight approximately 200), (e) 0.0275 moles per 100 grams of resin mixture of 1-dimethylcarbamoyl-4-phenylimidazole.

To this mixture, silver flake having a surface area ranging from 0.75 to 1.35 m$^2$/g, containing a maximum of 0.02% chloride, and a maximum particle dimension ranging from 0.5 $\mu$m to about 5 $\mu$m was added. The final composition was comprised of 28%, by weight, resin mixture and 72%, by weight, silver flake.

A quantity of the adhesive so prepared was sandwiched between two sheets (7×7 cm) of fluorinated ethylene-propylene polymer. Then the resultant sandwich was placed between two sheets of Bristol board and the adhesive worked down to a film less than 1 mm in thickness. The sandwich was then placed on a preheated aluminum plate in a circulating oven at a temperature of 175° C. The specimen was kept in the oven for 33 minutes.

Then, the sample was removed from the oven and permitted to cool after which the sheets were peeled away from the adhesive film. The film was then scribed with a sharp razor blade in a criss-cross pattern and diced by hand. The thermal stability of the cured composition was studied by thermogravimetric analysis using these dice.

Electrical resistivity was measured using a stripe specimen. This involved the use of a microscope slide to which two copper pads were bonded with an adhesive, 2.5 cm apart. Pressure sensitive tape was laid lengthwise over the pads from end to end of the slide. Two razor cuts, 2.5 mm apart, were then made lengthwise in the tape over the pads from end to end and the outer section of the tape so cut was peeled away. The conductive adhesive was forced into the opening using the edge of a microscope slide so that it was level with the top surface of the remaining tape which was then peeled away. There remained a stripe of adhesive bridging the copper pads which, after curing, was 2.5 mm wide and approximately 0.038 to 0.046 mm in thickness. Resistance was computed from the voltage drop across the stripe at a current of 100 milliamperes using a Keithley 160B Digital Multimeter and a Keithley 227 constant current source. The $T_g$ of a freshly prepared (as described above) cured sample and the resistivities of cured samples, as a function of the room-temperature age of the uncured material, so prepared are shown in Table 1 herein below:

TABLE 1

| $T_g$(°C.) | Resistivity, $\rho$(ohm-cm) (avg. of 2 specimens) | |
|---|---|---|
| 84 | initial | $1.09 \times 10^{-4}$ |
| | 25 hr. RT | $1.51 \times 10^{-4}$ |
| | 97 hr. RT | $1.30 \times 10^{-4}$ |
| | 117 hr. RT | $1.68 \times 10^{-4}$ |
| | 145 hr. RT | $2.44 \times 10^{-4}$ |
| | 169 hr. RT | $2.35 \times 10^{-4}$ |
| | 262 hr. RT | $2.02 \times 10^{-4}$ |
| | 362 hr. RT | $4.70 \times 10^{-3}$ |

TGA temperature scans of this material were compared with those of a commercially available conductive adhesive (Ablebond 36-2) and were found to be substantially superior to the latter.

EXAMPLE 2

The procedure of Example 1 was repeated with the exception that the resorcinol diglycidyl ether was eliminated and 40 parts, by weight, of butanediol diglycidyl ether was employed.

The $T_g$ of a freshly prepared cured sample, and the resistivities of cured samples as a function of the room-temperature age of the uncured material so prepared are shown in Table 2 below:

TABLE 2

| $T_g$(°C.) | Resistivity, $\rho$(ohm-cm) (avg. of 2 specimens) | |
|---|---|---|
| 75 | initial | $1.30 \times 10^{-4}$ |
| | 25 hr. RT | $1.43 \times 10^{-4}$ |
| | 52 hr. RT | $1.34 \times 10^{-4}$ |
| | 74 hr. RT | $1.18 \times 10^{-4}$ |
| | 100 hr. RT | $1.72 \times 10^{-4}$ |
| | 173 hr. RT | $1.18 \times 10^{-4}$ |
| | 270 hr. RT | $2.77 \times 10^{-4}$ |
| | 509 hr. RT | $6.26 \times 10^{-2}$ |

The formulation evidenced good room temperature stability and slow changes in resistivity with increasing age.

With reference now more particularly to the FIGURE, there is shown a typical device utilizing the adhesive composition described herein. Shown in the FIGURE is an electrically switched device 11, including a semiconductor chip 12, bonded by means of the adhesive described herein, 13, to electrical leads 14 and 15. Lead 14 is also bonded to a conductive terminal 16 which is connected to the negative pole of a source of dc current, the positive pole of which is connected to lead 15. A suitable electrochromic device may be obtained by potting chip 12 in lens 16 and providing a reflective support 17 for the device.

It will be appreciated by those skilled in the art that the described adhesive may be employed in a variety of devices wherein bonding of components is required. Typical of such devices are light emitting diodes, opto-isolators, integrated circuits, discrete transistors and the like.

We claim:

1. Device comprising a first electrically conductive or semiconducting member and a second electrically conductive or semiconducting member, said first member being bonded to said second member by a bonding agent, said bonding agent consisting essentially of (a) a polyfunctional epoxide, (b) a reactive viscosity reducer which is a mono or difunctional aliphatic diglycidyl ether, (c) a curing agent, and (d) a conductive material, characterized in that said curing agent consists essentially of an imidazole compound having the general formula

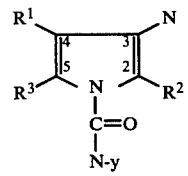

wherein $R^1$ represents hydrogen, a phenyl group or an alkoxyphenyl group having from 1–6 carbon atoms in the alkoxy chain; $R^2$ and $R^3$ represent an alkyl group of 1–6 carbon atoms, a phenyl group or hydrogen; and Y represents a cyclic group of the formula $(CH_2)_4$ or $(CH_2)_5$, or $O(CH_2)_4$; or two alkyl groups, $(R^4)_2$, wherein $R^4$ is an aklyl group having from 1–6 carbon atoms.

2. Device in accordance with claim 1 in which said curing agent is in said bonding agent in an amount in the range of 0.03–0.1 mole per mole of epoxy group.

3. Device in accordance with claim 1 in which said bonding agent further contains a conductivity enhancing agent.

4. Device in accordance with claim 1 in which said curing agent consists essentially of 1-(N-dimethylcarbamoyl)-4-phenylimidazole.

* * * * *